United States Patent
Eckert et al.

(10) Patent No.: US 11,631,829 B2
(45) Date of Patent: Apr. 18, 2023

(54) DUAL CURE PROTECTIVE DISPLAY FILM

(71) Applicant: 3M INNOVATIVE PROPERTIES COMPANY, St. Paul, MN (US)

(72) Inventors: Karissa L. Eckert, Ham Lake, MN (US); David Scott Thompson, Bayport, MN (US); Ryan M. Braun, St. Paul, MN (US); Catherine A. Leatherdale, Woodbury, MN (US); Michael A. Johnson, Stillwater, MN (US); Steven D. Solomonson, Shoreview, MN (US); Richard J. Pokorny, Maplewood, MN (US); John J. Stradinger, Roseville, MN (US); Kevin R. Schaffer, Woodbury, MN (US); Joseph D. Rule, Woodbury, MN (US); Peter D. Condo, Lake Elmo, MN (US); Derek W. Patzman, Savage, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 810 days.

(21) Appl. No.: 16/465,666

(22) PCT Filed: Nov. 30, 2017

(86) PCT No.: PCT/US2017/064061
§ 371 (c)(1),
(2) Date: May 31, 2019

(87) PCT Pub. No.: WO2018/102607
PCT Pub. Date: Jun. 7, 2018

(65) Prior Publication Data
US 2020/0028117 A1    Jan. 23, 2020

Related U.S. Application Data

(60) Provisional application No. 62/429,005, filed on Dec. 1, 2016.

(51) Int. Cl.
*B32B 27/40* (2006.01)
*H01L 51/52* (2006.01)
(Continued)

(52) U.S. Cl.
CPC .............. *H01L 51/524* (2013.01); *B32B 7/12* (2013.01); *B32B 27/08* (2013.01); *B32B 27/308* (2013.01);
(Continued)

(58) Field of Classification Search
CPC ......... B32B 7/12; B32B 27/308; B32B 27/40; B32B 2307/12; H01L 51/524; H01L 51/0097; H01L 51/5253; C09K 2323/05
(Continued)

(56) References Cited

U.S. PATENT DOCUMENTS

| 3,391,053 A | 7/1968 | Kolb |
| 3,574,030 A | 4/1971 | Callander |

(Continued)

FOREIGN PATENT DOCUMENTS

| CN | 102883878 | 1/2013 |
| JP | 2012091406 | 5/2012 |

(Continued)

OTHER PUBLICATIONS

Miller, "A New Derivation of Post Gel Properties of Network Polymers", Macromolecules, Mar. 1976, vol. 9, No. 2, pp. 206-211.
(Continued)

*Primary Examiner* — Ruiyun Zhang

(57) ABSTRACT

A display film includes a transparent polymeric substrate layer and a transparent energy dissipation layer disposed on the transparent polymeric substrate layer. The transparent energy dissipation layer includes cross-linked polyurethane and a polyacrylate polymer. The transparent energy dissi-
(Continued)

pation layer has a glass transition temperature of 27 degrees Celsius or less and a Tan Delta peak value of 0.5 or greater.

37 Claims, 5 Drawing Sheets

(51) Int. Cl.
  *B32B 7/12*   (2006.01)
  *B32B 27/08*  (2006.01)
  *B32B 27/30*  (2006.01)
  *C08G 18/24*  (2006.01)
  *C08G 18/34*  (2006.01)
  *C08G 18/42*  (2006.01)
  *C08G 18/66*  (2006.01)
  *C08G 18/78*  (2006.01)
  *C08J 5/18*   (2006.01)
  *H01L 51/00*  (2006.01)

(52) U.S. Cl.
  CPC ............ *B32B 27/40* (2013.01); *C08G 18/242* (2013.01); *C08G 18/34* (2013.01); *C08G 18/4244* (2013.01); *C08G 18/6625* (2013.01); *C08G 18/7893* (2013.01); *C08J 5/18* (2013.01); *H01L 51/004* (2013.01); *H01L 51/0097* (2013.01); *H01L 51/5253* (2013.01); *B32B 2250/02* (2013.01); *B32B 2250/24* (2013.01); *B32B 2307/412* (2013.01); *B32B 2307/732* (2013.01); *B32B 2457/202* (2013.01); *C08J 2375/14* (2013.01); *C09K 2323/05* (2020.08); *C09K 2323/057* (2020.08); *H01L 2251/558* (2013.01)

(58) Field of Classification Search
  USPC ........................................ 428/1.1, 1.5, 1.54
  See application file for complete search history.

(56) References Cited

U.S. PATENT DOCUMENTS

| | | | |
|---|---|---|---|
| 4,745,152 A | | 5/1988 | Fock |
| 4,921,759 A | | 5/1990 | Orain |
| 5,277,944 A | | 1/1994 | Holzer |
| 5,798,409 A | | 8/1998 | Ho |
| 6,132,882 A | * | 10/2000 | Landin .............. B32B 17/10761 |
| | | | 428/436 |
| 6,376,082 B1 | | 4/2002 | Edmond |
| 6,376,590 B2 | | 4/2002 | Kolb |
| 6,815,070 B1 | | 11/2004 | Burkle |
| 7,241,437 B2 | | 7/2007 | Davidson |
| 7,980,910 B2 | | 7/2011 | Padiyath |
| 8,263,731 B2 | | 9/2012 | Liu |
| 8,507,632 B2 | | 8/2013 | Hara |
| 8,551,279 B2 | | 10/2013 | Johnson |
| 9,780,318 B2 | | 10/2017 | Johnson |
| 10,005,264 B2 | | 6/2018 | Leatherdale |
| 10,316,245 B2 | | 6/2019 | Nelson |
| 2006/0148950 A1 | | 7/2006 | Davidson |
| 2007/0092733 A1 | | 4/2007 | Yang |
| 2008/0020170 A1 | | 1/2008 | Haubrich et al. |
| 2009/0280329 A1 | | 11/2009 | Rukavina |
| 2011/0045306 A1 | | 2/2011 | Johnson |
| 2012/0204566 A1 | | 8/2012 | Hartzell |
| 2012/0229893 A1 | | 9/2012 | Hebrink |
| 2013/0129977 A1 | | 5/2013 | Takihara |
| 2013/0251961 A1 | | 9/2013 | Johnson |
| 2013/0261209 A1 | | 10/2013 | Kim |
| 2014/0092360 A1 | | 6/2014 | Zheng |
| 2015/0056417 A1 | | 2/2015 | Yamazki |
| 2015/0207102 A1 | | 7/2015 | Jeong |
| 2015/0330597 A2 | | 11/2015 | Schaffer |
| 2016/0002103 A1 | | 1/2016 | Wang |
| 2016/0016338 A1 | | 1/2016 | Radcliffe |
| 2017/0165950 A1 | * | 6/2017 | Leatherdale .......... B32B 27/365 |

FOREIGN PATENT DOCUMENTS

| | | |
|---|---|---|
| WO | WO 2003-094256 | 11/2003 |
| WO | WO 2006-102383 | 9/2006 |
| WO | WO 2009-029438 | 3/2009 |
| WO | WO 2009-120548 | 10/2009 |
| WO | WO 2011-056396 | 5/2011 |
| WO | WO 2014-011731 | 1/2014 |
| WO | WO 2014-035942 | 6/2014 |
| WO | WO 2014-092422 | 6/2014 |
| WO | WO 2014-197194 | 12/2014 |
| WO | WO 2014-197368 | 12/2014 |
| WO | WO 2015-191949 | 12/2015 |
| WO | WO 2016-028542 | 2/2016 |
| WO | WO 2016-196460 | 12/2016 |
| WO | WO 2018-005833 | 1/2018 |
| WO | WO 2018-057774 | 3/2018 |

OTHER PUBLICATIONS

Ni, "A review on colorless and optically transparent polyimide films: Chemistry, process and engineering applications", Journal of Industrial and Engineering Chemistry, Aug. 2015, vol. 28, pp. 16-27.

International Search report on PCT International Application No. PCT/US2017/064061 dated Jun. 4, 2018, 3 pages.

* cited by examiner

DUAL CURE PROTECTIVE DISPLAY FILM

BACKGROUND

Displays and electronic devices have evolved to be curved, bent, or folded and provide new user experiences. These device architectures may include flexible organic light emitting diodes (OLEDs), plastic liquid crystal displays (LCDs) and the like, for example.

In order to realize such flexible displays and protect elements in the displays, a flexible cover sheet or flexible window film replaces a conventional glass cover sheet. This flexible cover sheet has a number of design parameters such as; high visible light transmission, low haze, excellent scratch resistance and impact resistance, in order to protect the elements included in the display devices. In some cases the flexible cover sheet may also need to withstand thousands of folding events around a tight bend radius (about 5 mm or less) without showing visible damage. In other cases, the flexible cover sheet must be able to unfold without leaving a visible crease after being bent at elevated temperature and humidity.

A variety of hard coated plastic substrates have been explored. More exotic materials like hard coated colorless transparent polyimide films have also been shown to have high hardness and good scratch resistance. However many hard coated films fail to withstand folding events around a tight bend radius without showing visible damage and fail to provide adequate impact resistance.

SUMMARY

The present disclosure relates to display films that can protect a display window and survive folding tests intact. The protective display film maintains optical properties of a display film while providing scratch resistance and impact resistance to the display.

In one aspect, a display film includes a transparent polymeric substrate layer and a transparent energy dissipation layer disposed on the transparent polymeric substrate layer. The transparent energy dissipation layer includes cross-linked polyurethane and a polyacrylate polymer. The transparent energy dissipation layer has a glass transition temperature of 27 degrees Celsius or less and a Tan Delta peak value of 0.5 or greater.

In another aspect, a display film includes a transparent energy dissipation layer and a transparent protective layer disposed on the transparent energy dissipation layer. The transparent energy dissipation layer includes cross-linked polyurethane and a polyacrylate polymer. The transparent energy dissipation layer has a glass transition temperature of 27 degrees Celsius or less and a Tan Delta peak value of 0.5 or greater.

In another aspect, a method includes combining polyurethane precursor materials with polyacrylate precursor materials to form a precursor mixture. Then the method includes selectively polymerizing the polyacrylate precursor materials to form a b-stage material. Then the method includes selectively crosslinking the polyurethane precursor materials within the b-stage material to form a transparent energy dissipation layer. The transparent energy dissipation layer includes cross-linked polyurethane and a polyacrylate polymer. The transparent energy dissipation layer has a glass transition temperature of 27 degrees Celsius or less and a Tan Delta peak value of 0.5 or greater.

In another aspect, an article includes an optical display and a display film described herein. An optical adhesive layer fixes the display film to the optical display.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1A:
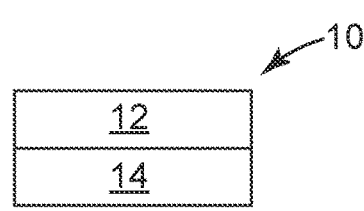
FIG. 1A is a schematic diagram side elevation view of an illustrative display film.

In the following detailed description, reference is made to the accompanying drawings that form a part hereof, and in which are shown by way of illustration for several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

The terms "display film", "protective film", and "protective display film" are herein used interchangeably.

"Transparent substrate" or "transparent layer" refers to a substrate or layer that has a high light transmission (typically greater than 90%) over at least a portion of the surface of the substrate over at least a portion of the light spectrum with wavelengths of about 350 to about 1600 nanometers, including the visible light spectrum (wavelengths of about 380 to about 750 nanometers).

"Polyurethane" refers to polymers prepared by the step-growth polymerization of hydroxyl-functional materials (materials containing hydroxyl groups —OH) with isocyanate-functional materials (materials containing isocyanate groups —NCO) and therefore contain urethane linkages (—O(CO)—NH—), where (CO) refers to a carbonyl group (C=O). The term may include "polyurethane-ureas" in which both urethane linkages and urea linkages are present.

"Polyacrylate" refers to polyacrylate or poly(meth)acrylate polymers prepared by the free radical polymerization of a precursor containing the reactive vinyl groups or vinylidene groups within acrylate end groups or (meth) acrylate end groups. Polyacrylate precursors include urethane acrylates which include both urethane and acrylate segments in the polymer chain.

The phrase "glass transition temperature" refers herein to the onset of the glass transition as determined by the location of the peak for E", where the polyurethane sample was characterized by DMA at an oscillation of 0.2% strain and 1 Hz throughout a temperature ramp from −50° C. to 200° C. at a rate of 2° C. per minute.

The phrase "Tan Delta peak value" and peak temperature is measured according to the DMA analysis described in the Examples.

The term "b-stage" refers to a material that is polymerized and or cross-linked to increase molecular weight and viscosity.

The term "cure" refers to polymerizing or cross-linking or both polymerizing and cross-linking.

The term "catalyst" refers to material that catalyzes an isocyanate reaction with polyol to form polyurethane. The catalyst may be a thermal catalyst.

The present disclosure relates to a display film or protective display film that can protect a display window and survive folding tests intact. The protective display film maintains optical properties while providing scratch resistance to the display. These protective display films include a transparent energy dissipation layer that includes both cross-linked polyurethane and polyacrylate polymers. The transparent energy dissipation layer may be dual cured to first polymerize either the polyurethane or polyacrylate and then polymerize the remaining polyurethane or polyacrylate. The transparent energy dissipation layer may include both a photoinitiator (for photo-curing or photo-initiation of polymerization) and a catalyst (for thermal curing). The protective display film may be thin and optically clear. The protective display film may be combined with foldable or flexible electronics (such as an optical display, for example) and may provide an abrasion resistance outer surface and a flexible and durable inner layer having a low glass transition temperature. The protective display film may be formed of an aliphatic cross-linked polyurethane material that is transparent and a polyacrylate material that is transparent and may be cross-linked. The protective display film exhibits a haze value of 5% or less or 3% or less or 2% or less or 1% or less. The protective display film exhibits a visible light transmission of 85% or greater or 90% or greater, or 93% or greater. The protective display film exhibits a clarity of 95% or greater, or 97% or greater, or 99% or greater. The transparent energy dissipation layer may have a glass transition temperature of 27 degrees Celsius or less, or 15 degrees Celsius or less, or 10 degrees Celsius or less, or 5 degrees Celsius or less, or 0 degrees Celsius or less. The transparent energy dissipation layer may have a Tan Delta peak value in a range from 0.5 to 2.5 or from 1 to 2 or from 1.2 to 2. The protective display film may exhibit a room temperature scratch resistance or recovery and may be able to withstand at least 100,000 folding cycles without failure or visible defects. These protective display film can withstand a bend radius of 5 mm or less, or 4 mm or less, or 3 mm or less, or 2 mm or less, or even 1 mm or less without failure or visible defects, such as delamination, cracking, or haze. This disclosure describes formulations designed to give a cured energy dissipation layer where the formulation may be b-staged or may be made to build viscosity via a first type of polymerization of the polyacrylic precursor material prior to the second type of polymerization of the polyurethane isocyanate and polyol components. This b-stage step may provide beneficial build in viscosity that reduces defects during processing and improves the general manufacturability of the protective display films. While the present disclosure is not so limited, an appreciation of various aspects of the disclosure will be gained through a discussion of the examples provided below.

FIG. 1A is a schematic diagram side elevation view of an illustrative display film 10. The terms "display film", "cover film", "protective film", "protective cover film" or "protective display film" are used interchangeably herein. The display film 10 includes a transparent polymeric substrate layer 12 and a transparent energy dissipation layer 14 disposed on the transparent polymeric substrate layer 12. The transparent energy dissipation layer 14 includes cross-linked polyurethane and a polyacrylate polymer. The transparent energy dissipation layer 14 may have a glass transition temperature of 27 degrees Celsius or less. The transparent energy dissipation 14 may have a Tan Delta peak value of 0.5 or greater, or in a range from 0.5 to 2.5, or 1 to 2.5 or 1 to 2.

Figure 1B:
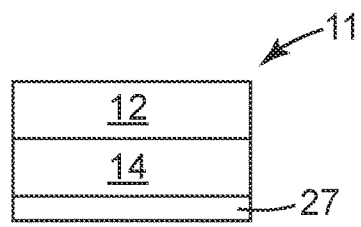
FIG. 1B is a schematic diagram side elevation view of an illustrative display film.

FIG. 1B shows a schematic diagram side elevation view of an illustrative display film 11, in one possible delivery format where the energy dissipation layer 14 has a protective liner/premask 27 disposed thereon.

Figure 2A:
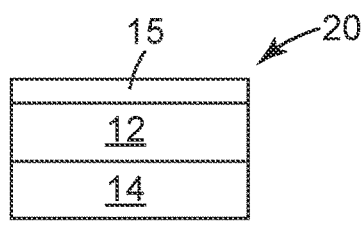
FIG. 2A is a schematic diagram side elevation view of another illustrative display film.

FIG. 2A is a schematic diagram side elevation view of an illustrative display film 20 that includes a protective layer 15. The protective layer 15 is disposed on the transparent polymeric substrate layer 12, and the transparent polymeric substrate layer 12 separates the transparent energy dissipation layer 14 from the protective layer 15. The protective layer 15 provides abrasion resistance to the display film and may also be referred to as an abrasion resistant layer. A protective layer or abrasion resistant layer may include a glass layer, a hardcoat layer, a nanoparticle nanocomposite ionic elastomeric layer, or an elastic nanocomposite urethane layer.

Figure 2B:
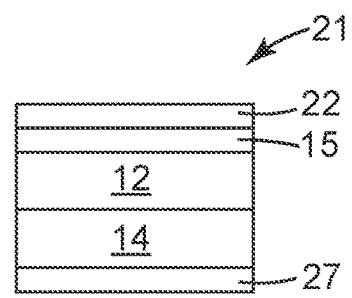
FIG. 2B is a schematic diagram side elevation view of another illustrative display film.

FIG. 2B is a schematic diagram side elevation view of an illustrative display film 21, showing another possible delivery format where the energy dissipation layer 14 has a protective liner/premask 27 disposed thereon and the protective layer 15 has a premask 22 disposed thereon.

Figure 2C:
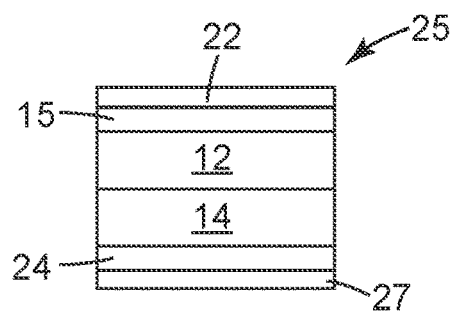
FIG. 2C is a schematic diagram side elevation view of another illustrative display film.

FIG. 2C is a schematic diagram side elevation view of an illustrative display film 25 that includes the construction of FIG. 2A with an optional adhesive layer 24 and release liners 22, 27 defining the outer surfaces of the illustrative display film 25. The adhesive layer 24 is disposed on the transparent energy dissipation layer 14. The transparent energy dissipation layer 14 separates the transparent polymeric substrate layer 12 from the adhesive layer 24.

The adhesive layer 24 may be an optical adhesive. The adhesive layer 24 may be a pressure sensitive adhesive. The adhesive layer 24 may be included in any of the display film constructions described herein. One or both of the release liners 22, 27 may be included in any of the display film constructions described herein. The release liners may also be referred to as "premask" layers that may be easily removed for application to an optical display or to reveal the display film, before or after placement onto an optical display. The optical adhesive layer may be formed of acrylate, silicone, silicone polyoxamide, silicone polyurea, polyolefin, polyester, polyurethane or polyisobutylene.

The removable liners (or premask layers) 22, 27 may provide transport protection to the underlying display film 12, 14, 15 and optional optical adhesive layer 24. The removable liners 22, 27 may have a layer or surface that has a low surface energy to allow clean removal of the liner 22, 27 from the display film and optional optical adhesive layer 24. The removable liners 22, 27 may be a layer of polyester coated with a silicone, for example. The removable liner 27 may provide temporary structure to the optional optical adhesive layer 24. For example, WO2014/197194 and WO2014/197368 describe removable liners that emboss an optical adhesive layer where the optical adhesive losses its structures once the removable liner is stripped away from the optical adhesive layer.

Figure 3A:
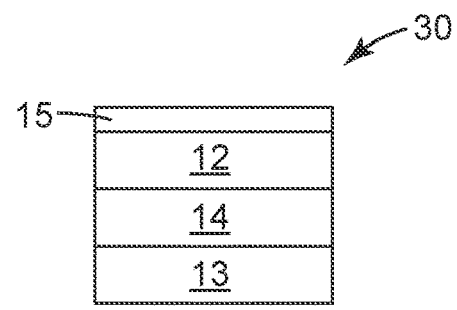
FIG. 3A is a schematic diagram side elevation view of another illustrative display film.

FIG. 3A is a schematic diagram side elevation view of another illustrative display film 30 that includes the construction of FIG. 2A with a second transparent substrate layer 13. The second transparent polymeric substrate layer 13 is disposed on the transparent energy dissipation layer 14. The transparent energy dissipation layer 14 separates the transparent polymeric substrate layer 12 from the second transparent polymeric substrate layer 13.

Figure 3B:
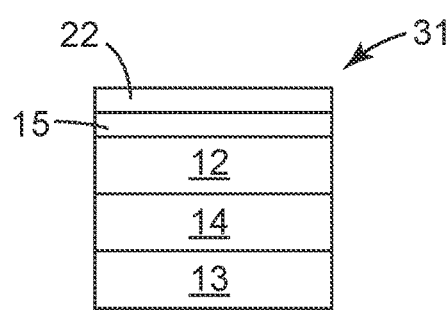
FIG. 3B is a schematic diagram side elevation view of another illustrative display film.

FIG. 3B is a schematic diagram side elevation view of an illustrative display film 31, showing another possible delivery format where the protective layer 15 has a premask 22 disposed thereon.

Figure 3C:
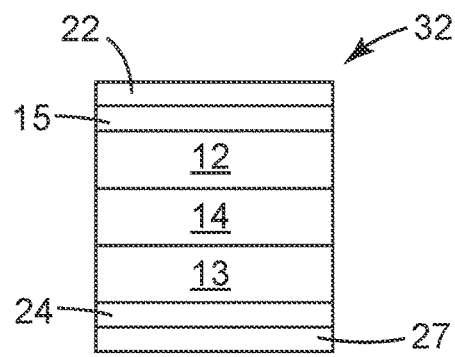
FIG. 3C is a schematic diagram side elevation view of another illustrative display film.

FIG. 3C is a schematic diagram side elevation view of an illustrative display film 32 that includes the construction of FIG. 3A with an optional adhesive layer 24 and release liners 22, 27 defining the outer surfaces of the illustrative display film 30. The adhesive layer 24 is disposed on the second substrate layer 13. The second transparent polymeric substrate layer 13 separates the energy dissipation layer 14 from the adhesive layer 24

Figure 4A:
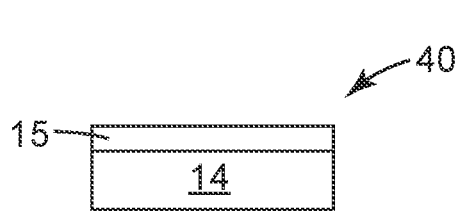
FIG. 4A is a schematic diagram side elevation view of another illustrative display film.

FIG. 4A is a schematic diagram side elevation view of another illustrative display film 40. A transparent protective layer 15 is disposed on a transparent energy dissipation layer 14. The transparent energy dissipation layer 14 includes cross-linked polyurethane and a polyacrylate polymer. The transparent energy dissipation layer 14 may have a glass transition temperature of 27 degrees Celsius or less. The transparent polyurethane layer 14 may have a Tan Delta peak value of 0.5 or greater, or in a range from 0.5 to 2.5, or 1 to 2.5 or 1 to 2. The protective layer 15 provides abrasion resistance to the display film and may also be referred to as an abrasion resistant layer. A protective layer or abrasion resistant layer includes a glass layer, a hardcoat layer, a nanoparticle nanocomposite ionic elastomeric layer, or an elastic nanocomposite urethane layer.

Figure 4B:
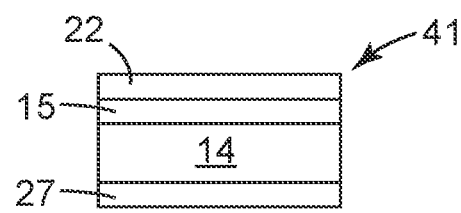
FIG. 4B is a schematic diagram side elevation view of another illustrative display film.

FIG. 4B is a schematic diagram side elevation view of an illustrative display film 41 that includes the construction of FIG. 4A having release liners/premask layers 22, 27 defining the outer surfaces of the illustrative display film 40.

Figure 4C:
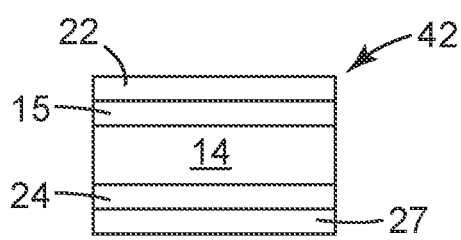
FIG. 4C is a schematic diagram side elevation view of another illustrative display film.

FIG. 4C is a schematic diagram side elevation view of an illustrative display film 42 that includes the construction of FIG. 4a with an optional adhesive layer 24 and release liners 22, 27 defining the outer surfaces of the illustrative display film 40. The adhesive layer 24 is disposed on the energy dissipation layer 14 and the energy dissipation layer 14 separates the protective layer 15 from the adhesive layer 24.

Figure 5A:
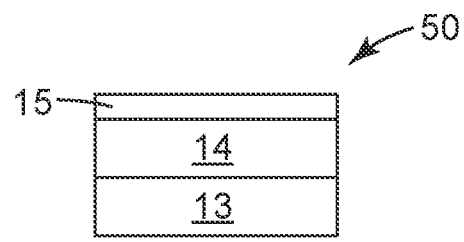
FIG. 5A is a schematic diagram side elevation view of another illustrative display film.

FIG. 5A is a schematic diagram side elevation view of another illustrative display film 50 that includes the construction of FIG. 4A with a second transparent substrate layer 13. The second transparent polymeric substrate layer 13 is disposed on the transparent energy dissipation layer 14. The transparent energy dissipation layer 14 separates the transparent protective layer 15 from the second transparent polymeric substrate layer 13.

Figure 5B:
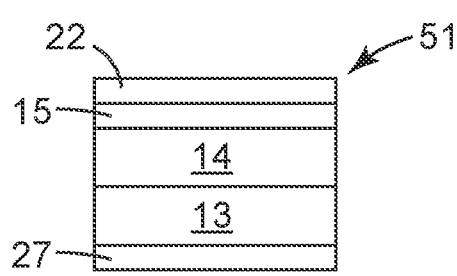
FIG. 5B is a schematic diagram side elevation view of another illustrative display film.

FIG. 5B is a schematic diagram side elevation view of an illustrative display film 51, that includes the construction of FIG. 5A having release liners/premask layers 22, 27 defining the outer surfaces of the illustrative display film 50.

Figure 5C:
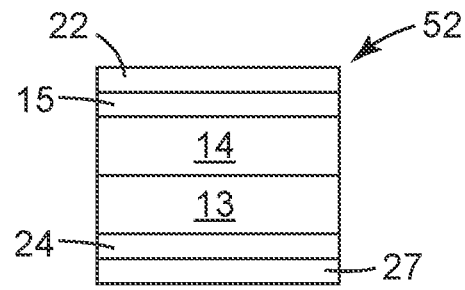
FIG. 5C is a schematic diagram side elevation view of another illustrative display film.

FIG. 5C is a schematic diagram side elevation view of an illustrative display film 52 that includes the construction of FIG. 5A with an optional adhesive layer 24 and release liners 22, 27 defining the outer surfaces of the illustrative display film 50. The adhesive layer 24 is disposed on the second substrate layer 13. The second polymeric substrate layer 13 separates the energy dissipation layer 14 from the adhesive layer 24.

The illustrative display film constructions described above may include a colored border that defines a viewing window. This border may be produced by use of ink or may comprise a decorative film. The border may be a continuous frame element printed, for example, onto the transparent energy dissipation layer or the substrate layer, for example.

Figure 6A:
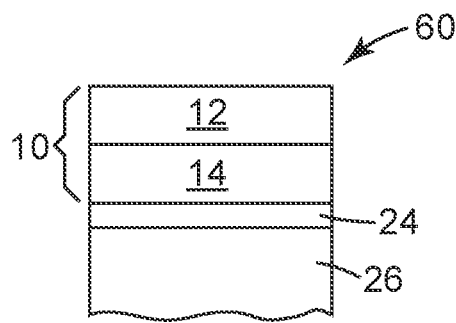
FIG. 6A is a schematic diagram side elevation view of an illustrative display film on an optical display forming an article.

FIG. 6A is a schematic diagram side elevation view of an illustrative display film 10 on an optical element 26 forming an article 60. An adhesive layer 24 (such as an optical adhesive) adheres the display film 10 to the optical element 26. In some cases the optical adhesive permanently fixes the display film to the optical element 26. In other cases the display film and optical adhesive can be removed/debonded/repositioned, relative to the optical element 26, with the application of heat or mechanical force such that the display film is replaceable or repositionable by the consumer. The outer surface of the display article 60 is a transparent polymeric substrate 12.

Figure 6B:
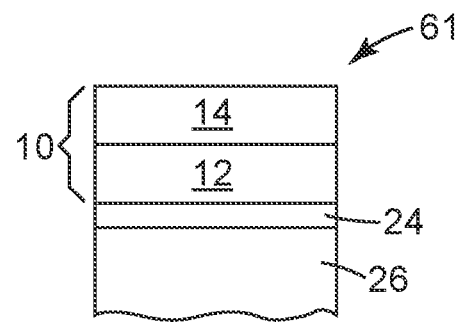
FIG. 6B is a schematic diagram side elevation view of an illustrative display film on an optical display forming an article.

FIG. 6B is a schematic diagram side elevation view of an illustrative display film 10 on an optical element 26 forming an article 61. An adhesive layer 24 (such as an optical adhesive) adheres the display film 10 to the optical element 26. In some cases the optical adhesive permanently fixes the display film to the optical element 26. In other cases the display film and optical adhesive can be removed/debonded/repositioned, relative to the optical element 26, with the application of heat or mechanical force such that the display film is replaceable or repositionable by the consumer. The outer surface of the display article 61 is energy dissipation layer 14. The energy dissipation layer 14 may have shape memory properties such that the energy dissipation layer 14 can be deformed, for example by a scratch, and then recover its original shape and appearance.

Figure 6C:
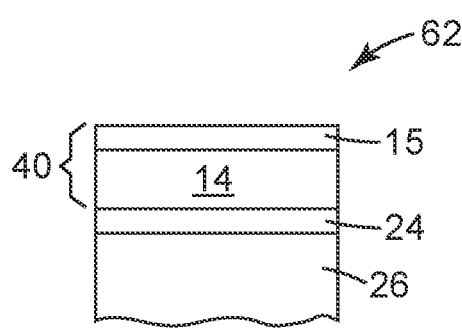
FIG. 6C is a schematic diagram side elevation view of an illustrative display film on an optical display forming an article.

FIG. 6C is a schematic diagram side elevation view of an illustrative display film 40 on an optical element 26 forming an article 62. An adhesive layer 24 (such as an optical adhesive) adheres the display film 40 to the optical element 26. In some cases the optical adhesive permanently fixes the display film to the optical element 26. In other cases the display film and optical adhesive can be removed/debonded/repositioned, relative to the optical element 26, with the application of heat or mechanical force such that the display film is replaceable or repositionable by the consumer. The outer surface of the display article 62 is a protective layer disposed directly on transparent energy dissipation layer 14.

Figure 6D:
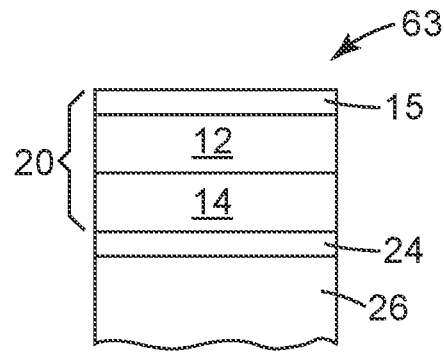
FIG. 6D is a schematic diagram side elevation view of an illustrative display film on an optical display forming an article.

FIG. 6D is a schematic diagram side elevation view of an illustrative display film 20 on an optical element 26 forming an article 63. An adhesive layer 24 (such as an optical adhesive) adheres the display film 20 to the optical element 26. In some cases the optical adhesive permanently fixes the display film to the optical element 26. In other cases the display film and optical adhesive can be removed/debonded/repositioned, relative to the optical element 26, with the application of heat or mechanical force such that the display film is replaceable or repositionable by the consumer. The outer surface of the display article 63 is a protective layer disposed on a transparent substrate 12, where transparent substrate 12 separates the protective layer 15 and transparent energy dissipation layer 14.

Figure 6E:
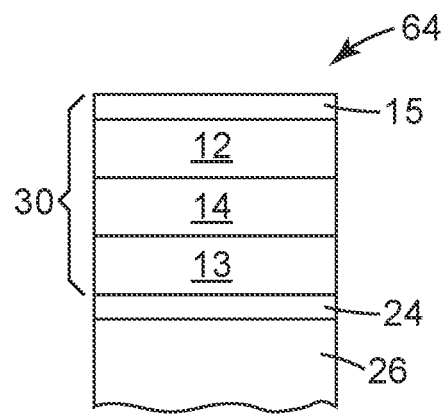
FIG. 6E is a schematic diagram side elevation view of an illustrative display film on an optical display forming an article.

FIG. 6E is a schematic diagram side elevation view of an illustrative display film 30 on an optical element 26 forming an article 64. An adhesive layer 24 (such as an optical adhesive) adheres the display film 30 to the optical element 26. In some cases the optical adhesive permanently fixes the display film to the optical element 26. In other cases the display film and optical adhesive can be removed/debonded/repositioned, relative to the optical element 26, with the application of heat or mechanical force such that the display film is replaceable or repositionable by the consumer. The outer surface of the display article 64 is a protective layer 15 disposed on a transparent substrate 12, where transparent substrate 12 separates the protective layer 15 and transparent energy dissipation layer 14. The second transparent substrate 13 separates the transparent energy dissipation layer 14 from the adhesive layer 24.

Figure 6F:
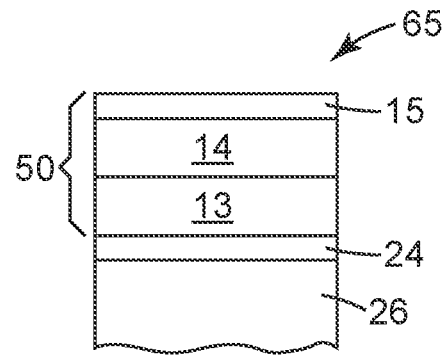
FIG. 6F is a schematic diagram side elevation view of an illustrative display film on an optical display forming an article.

FIG. 6F is a schematic diagram side elevation view of an illustrative display film 50 on an optical element 26 forming an article 65. An adhesive layer 24 (such as an optical adhesive) adheres the display film 50 to the optical element 26. In some cases the optical adhesive permanently fixes the display film to the optical element 26. In other cases the display film and optical adhesive can be removed/debonded/repositioned, relative to the optical element 26, with the application of heat or mechanical force such that the display film is replaceable or repositionable by the consumer. The outer surface of the display article 65 is a protective layer 15 disposed on a transparent energy dissipation layer 14, where the transparent energy dissipation layer 14 separates the second transparent substrate 13 from the protective layer 15. The second transparent substrate 13 separates the transparent energy dissipation layer 14 from the adhesive layer 24.

Figure 7:
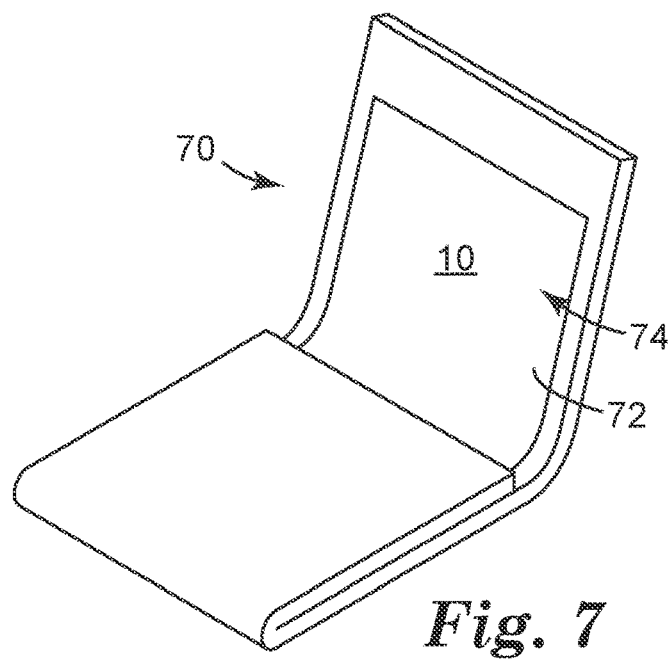
FIG. 7 is a schematic diagram perspective view of an illustrative folding article including an illustrative display film.

FIG. 7 is a schematic diagram perspective view of an illustrative folding display device 70 including an illustrative display film 10. The display film 10 may be any of the display film constructions described herein disposed on an optical element such as an optical display 74. The display device may not be a folding article and may only flex within a certain range, or may be a static curved display device.

An optical display 74 may form at least a portion of display device. The display device 70 may include a display window 72. The display device 70 can be any useful article such as a phone or smartphone, electronic tablet, electronic notebook, computer, and the like. The optical display may include an organic light emitting diode (OLED) display panel. The optical display may include a liquid crystal display (LCD) panel or a reflective display. Examples of reflective displays include electrophoretic displays, electrofluidic displays (such as an electrowetting display), interferometric displays or electronic paper display panels, and are described in US 2015/0330597. Further examples of optical displays include static display such as commercial graphic signs and billboards.

The display film 10 and the optical display 74 may be foldable so that the optical display 74 faces itself and at least a portion of display film 10 contacts or directly faces another portion of the protective film 10, as illustrated in FIG. 7. The display film 10 and the optical display 74 may be flexible or bendable or foldable so that a portion of the display film 10 and the optical display 74 can articulate relative to another portion of the display film 10 and the optical display 74. The display film 10 and the optical display 74 may be flexible or bendable or foldable so that a portion of the display film 10 and the optical display 74 can articulate at least 90 degrees or at least 170 degrees relative to another portion of the display film 10 and the optical display 74.

The display film 10 and the optical display 74 may be flexible or bendable or foldable so that a portion of the display film 10 and the optical display 74 can articulate relative to another portion of the display film 10 and optical display 74 to form a bend radius of 3 mm or less in the display film 10 at the bend or fold line. The display film 10 and the optical display 74 may be flexible or bendable or foldable so that a portion of the display film 10 and optical display 74 can articulate relative to another portion of the display film 10 and the optical display 74 to form a bend radius such that the display film 10 overlaps itself and is separated from each other by a distance on 10 mm or less, or 6 mm or less or 3 mm or less or contacts each other. While FIG. 7 shows the display device 74 folding inward, where the surface of the display film 10 approach each other, there are other cases in which the display device may fold in the opposite or outward direction (out-folding) such that the display film 10 is on the outer surface of the display device.

The protective films described herein may be constructed in a number of ways, but include an energy dissipation layer that provides beneficial properties in impact while not leading to failure in dynamic folding events, even at low temperatures.

The display film may have a haze value of 5% or less, or 3% or less, or 2% or less, or 1% or less. The display film may have a clarity of 95% or greater, or 98% or greater. The display film may have a visible light transmission of 85% or greater, or 90% or greater, or 93% or greater.

The display film may have a yellow index or b* value of 5 or less, or 4 or less, or 3 or less, or 2 or less, or 1 or less. In many embodiments the display film may have a yellow index or b* value of 1 or less.

The display film may maintain a haze value of 5% or less, or 3% or less, or 2% or less, or 1% or less after at least 100,000 bending or folding cycles about a 3 mm radius. The display film may maintain a stable haze value, or remain intact without cracking or delaminating, after at least 100,000 bending or folding cycles about a 5 mm radius, or about a 4 mm radius, or about a 3 mm radius, or about a 2 mm radius, or about a 1 mm radius. The display film may remain intact after at least 100,000 bending or folding cycles about a 3 mm radius or less.

The display film may have any useful thickness. In many embodiments the display film has a thickness of 500 micrometers or less, or 400 micrometers or less, or 300 micrometers or less, or 200 micrometers or less. The thickness of the display film is a balance between being thick enough to provide the desired display protection and thin enough to provide the folding and reduced thickness design parameters.

The display film may include one or more additional layers. Additional layers may include conductive layers for touch sensitive display elements or barrier layers. One or more additional transparent polymeric substrate layers may be disposed in the display film of any useful polymeric material that provides desired mechanical properties (such as dimensional stability) and optical properties (such as light transmission and clarity) to the display film. Examples of materials suitable for use in the polymeric substrate layer include polymethylmethacrylate, polycarbonate, polyamides, polyimide, polyesters (PET, PEN), polycyclic olefin polymers, and thermoplastic polyurethanes.

The optional one or more barrier layers may include a transparent barrier layer. The transparent barrier layer may be disposed on the substrate or the protective layer or the energy dissipation layer. The transparent barrier layer can mitigate or slow ingress of oxygen or water through the display film. Transparent barrier layers may include for example, thin alternating layers of silica, alumina or zirconia together with an organic resin. Exemplary transparent barrier layer are described in U.S. Pat. No. 7,980,910 and WO2003/094256.

Optional additional layers may include a microstructure layer, an anti-glare layer, anti-reflective layer, or an anti-fingerprint layer. Additional optional layers may be disposed in the interior of the display film. One useful additional layer disposed within the display film is a sparkle reduction layer as described in WO2015/191949. The sparkle reduction layer may be particularly useful with high definition displays that include anti-glare coatings.

The transparent polymeric substrate layer 12 may have any useful thickness. In many embodiments the transparent polymeric substrate layer 12 has a thickness in a range from 10 to 100 micrometers or from 20 to 80 micrometers.

The transparent polymeric substrate layer 12 may be formed of any useful polymeric material that provides the desired mechanical properties (such as dimensional stability) and optical properties (such as light transmission and clarity) to the display film. Examples of materials suitable for use in the polymeric substrate layer 12 include polymethylmethacrylate, polycarbonate, polyamides, polyimide, polyesters (PET, PEN), polycyclic olefin polymers, and thermoplastic polyurethanes.

The transparent polymeric substrate layer 12 may have any useful tensile modulus or offset yield stress value. The transparent polymeric substrate layer 12 may have an offset yield stress value that is greater than 50 MPa or greater than 75 MPa. The phrase "yield stress" or "offset yield stress" refers herein to "0.2% offset yield strength" as defined in ASTM D638-14. ASTM D638-14 section A2.6 defines the test method for "offset yield strength" and is defined as the stress at which the strain exceeds by a specified amount (the offset) an extension of the initial proportional portion of the stress-strain curve. It is expressed in force per unit area, usually megapascals (poundsforce per square inch).

The transparent polymeric substrate layer 12 may be primed or treated to impart some desired property to one or more of its surfaces. In particular the transparent polymeric substrate layer 12 can be primed to improve adhesion of the transparent energy dissipation layer 14 with the transparent polymeric substrate layer 12. Examples of such treatments include corona, flame, plasma and chemical treatments such as, acrylate or silane treatments.

The transparent energy dissipation layer 14 may have any useful thickness. In many embodiments the transparent energy dissipation layer 14 has a thickness of 100 micrometers or greater, or in a range from 100 to 300 micrometers or from 100 to 250 micrometers. The thickness of the transparent energy dissipation layer 14 is a balance between being thick enough to provide the desired protection to the display and particularly to the transparent polymeric substrate layer 12 and thin enough to provide the folding and reduced thickness design parameters.

The transparent energy dissipation layer 14 may be formed by mixing the polyurethane precursor components with the polyacrylate precursor components. The polyurethane and the polyacrylate polymers are formed via distinct initiators. This allows the polyacrylate polymer to be selectively formed without forming the polyurethane polymer. The polyurethane polymer may be formed with the use of a catalyst (thermal curing) and the polyacrylate may be formed with the use of a photoinitiator (UV or light curing), for example.

The transparent energy dissipation layer precursor (containing both the polyurethane precursor components with the polyacrylate precursor components with both photoinitiator and catalyst) may be coated onto the transparent polymeric substrate layer 12 (that may be primed) and then the polyacrylate polymer may be selectively polymerized or cross-linked (via UV curing) to form a b-stage layer. Then this b-stage layer can be cured or cross-linked to form the thermoset or cross-linked polyurethane polymer and complete the formation of the transparent energy dissipation layer 14.

The transparent energy dissipation layer 14 may contain from 1 to 50% wt polyacrylate polymer. The transparent energy dissipation layer 14 may contain from 50 to 99% wt cross-linked polyurethane polymer. The transparent energy dissipation layer 14 may contain from 1 to 20% wt polyacrylate polymer. The transparent energy dissipation layer 14 may contain from 2 to 15% wt polyacrylate polymer. The transparent energy dissipation layer 14 may contain from 3 to 10% wt polyacrylate polymer. The transparent energy dissipation layer 14 may contain from 80 to 99% wt cross-linked polyurethane polymer. The transparent energy dissipation layer 14 may contain from 85 to 98% wt cross-linked polyurethane polymer. The transparent energy dissipation layer 14 may contain from 90 to 97% wt cross-linked polyurethane polymer. The transparent energy dissipation layer 14 may contain both a photoinitiator and a catalyst.

When the transparent energy dissipation layer 14 contains less than about 10% wt polyacrylate (based on wt % of polyacrylate precursor material in the precursor mixture), it is believed that the polyacrylate defines a mainly a linear or branched polymer. When the transparent energy dissipation layer 14 contains about 10% wt to about 20% wt polyacrylate (based on wt % of polyacrylate precursor material in the precursor mixture), it is believed that the polyacrylate defines a branched or cross-linked polymer. When the transparent energy dissipation layer 14 contains about 20% wt to about 50% wt poly acrylate (based on wt % of polyacrylate precursor material in the precursor mixture), it is believed that the polyacrylate defines mainly a cross-linked polymer. Cross-linked polyacrylate may define an interpenetrating network with the cross-linked polyurethane in the transparent energy dissipation layer 14.

Polyurethane is a polymer composed of organic units joined by carbamate (urethane) links. The polyurethanes described herein are thermosetting polymers that do not melt when heated. Polyurethane polymers may be formed by reacting a di- or polyisocyanate with a polyol. Both the isocyanates and polyols used to make polyurethanes contain on average two or more functional groups per molecule. The polyurethanes described herein may have a functionality greater than 2.4 or 2.5.

A wide variety of polyols may be used to form the aliphatic cross-linked polyurethane component of the transparent energy dissipation layer. The term polyol includes hydroxyl-functional materials that generally include at least 2 terminal hydroxyl groups. Polyols include diols (materials with 2 terminal hydroxyl groups) and higher polyols such as triols (materials with 3 terminal hydroxyl groups), tetraols (materials with 4 terminal hydroxyl groups), and the like. Typically the reaction mixture contains at least some diol and may also contain higher polyols. Higher polyols are particularly useful for forming crosslinked polyurethane polymers. Diols may be generally described by the structure HO—B—OH, where the B group may be an aliphatic group, an aromatic group, or a group containing a combination of aromatic and aliphatic groups, and may contain a variety of linkages or functional groups, including additional terminal hydroxyl groups.

Polyester polyols are particularly useful. Among the useful polyester polyols useful are linear and non-linear polyester polyols including, for example, polyethylene adipate, polybutylene succinate, polyhexamethylene sebacate, polyhexamethylene dodecanedioate, polyneopentyl adipate, polypropylene adipate, polycyclohexanedimethyl adipate, and poly ε-caprolactone. Particularly useful are aliphatic polyester polyols available from King Industries, Norwalk, Conn., under the trade name "K-FLEX" such as K-FLEX 188 or K-FLEX A308.

A wide variety of polyisocyanates may be used to form the aliphatic cross-linked polyurethane component of the transparent energy dissipation layer. The term polyisocyanate includes isocyanate-functional materials that generally include at least 2 terminal isocyanate groups. Polyisocyanates include diisocyanates (materials with 2 terminal isocyanate groups) and higher polyisocyanates such as triisocyanates (materials with 3 terminal isocyanate groups), tetraisocyanates (materials with 4 terminal isocyanate groups), and the like. Typically the reaction mixture contains at least one higher isocyanate if a difunctional polyol is used. Higher isocyanates are particularly useful for forming cross-linked polyurethane polymers. Diisocyanates may be generally described by the structure OCN—Z—NCO, where the Z group may be an aliphatic group, an aromatic group, or a group containing a combination of aromatic and aliphatic groups.

Higher functional polyisocyanates are particularly useful, such as triisocyanates, to form a crosslinked polyurethane polymer. Triisocyanates include, but are not limited to, polyfunctional isocyanates, such as those produced from biurets, isocyanurates, adducts, and the like. Some commercially available polyisocyanates include portions of the DESMODUR and MONDUR series from Bayer Corporation, Pittsburgh, Pa., and the PAPI series from Dow Plastics, a business group of the Dow Chemical Company, Midland, Mich. Particularly useful triisocyanates include those available from Bayer Corporation under the trade designations DESMODUR N3300A and MONDUR 489. One particularly suitable aliphatic polyisocyanate is DESMODUR N3300A.

The reactive mixture used to form the transparent aliphatic cross-linked polyurethane component of the transparent energy dissipation layer also contains a catalyst. The catalyst facilitates the step-growth reaction between the polyol and the polyisocyanate. Conventional catalysts generally recognized for use in the polymerization of urethanes may be suitable for use with the present disclosure. For example, aluminum-based, bismuth-based, tin-based, vanadium-based, zinc-based, or zirconium-based catalysts may be used. Tin-based catalysts are particularly useful. Tin-based catalysts have been found to significantly reduce the amount of outgassing present in the polyurethane. Most desirable are dibutyltin compounds, such as dibutyltin diacetate, dibutyltin dilaurate, dibutyltin diacetylacetonate, dibutyltin dimercaptide, dibutyltin dioctoate, dibutyltin dimaleate, dibutyltin acetonylacetonate, and dibutyltin oxide. In particular, the dibutyltin dilaurate catalyst DABCO T-12, commercially available from Air Products and Chemicals, Inc., Allentown, Pa. is particularly suitable. The catalyst is generally included at levels of at least 200 ppm or even 300 ppm or greater. The catalyst may be present in the final formed films at levels of at least 100 ppm or in a range from 100-500 ppm.

The cross-linked polyurethane fraction of the energy dissipation layer 14 may have a cross-link density in a range from 0.1 to 1.0 mol/kg or from 0.2 to 0.9 mol/kg or from 0.37 to 0.74 mol/kg. The crosslink density of the cured polyurethane is calculated using the method described in Macromolecules, Vol. 9, No. 2, pages 206-211 (1976). To implement this model, integral values for chemical functionality are required. DESMODUR N3300 is reported to have an average functionality of 3.5 and an isocyanate equivalent weight of 193 g/equiv. This material was represented in the mathematical model as a mixture of 47.5 wt % HDI trimer (168.2 g/equiv.), 25.0 wt % HDI tetramer (210.2 g/equiv.), and 27.5 wt % of HDI pentamer (235.5 g/equiv.). This mixture yields an average equivalent weight of 193 g/equiv. and an average functionality of 3.5. Desmodur N3400 is reported to have an average functionality 2.5 and an equivalent weight of 193, and it is reported to be blend of the HDI isocyanurate trimer and HDI uretdione dimer. This material was represented in the mathematical model as a mixture of 19 wt % HDI isocyanurate trimer, 33 wt % HDI uretdione dimer, and 10 wt % of HDI uretdione trimer and 38 wt % of HDI tetramer having one isocyanurate group and one uretdione group. In the mathematical model, the functionality was determined by the sum the isocyanate groups and the uretdione groups in the cases where there was an excess of hydroxyl groups relative to the sum of the isocyanate and uretdione groups.

The polyacrylate polymer is polymerized or cross-linked. The polyacrylate polymer may be formed of acrylate monomers or oligomers. In some embodiments, the polyacrylate is a polyacrylate homopolymer. The acrylate monomers or oligomers are multifunctional to enable polymerization or cross-linking of the polyacrylate polymer. The polyacrylate polymer may be formed with the aid of an initiator, such as a photo-initiator, for example. The polyacrylate polymer may be formed of oligomers that include acrylate and urethane segments, or acrylate and urethane compatible segments. The polyacrylate polymer may be aliphatic.

The polyacrylate polymer may be formed of multifunctional (meth)acrylic monomers, oligomers, and polymers, where the individual resins can be difunctional, trifunctional, tetrafunctional or higher functionality. Useful multifunctional acrylate monomers and oligomers include:
(a) di(meth)acryl containing monomers such as 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, tripropylene glycol diacrylate;
(b) tri(meth)acryl containing monomers such as glycerol triacrylate, trimethylolpropane triacrylate, ethoxylated triacrylates (e.g., ethoxylated trimethylolpropane triacrylate), propoxylated triacrylates (e.g., propoxylated glyceryl triacrylate, propoxylated trimethylolpropane triacrylate), trimethylolpropane triacrylate, tris(2-hydroxyethyl)isocyanurate triacrylate;
(c) higher functionality (meth)acryl containing monomer such as ditrimethylolpropane tetraacrylate, dipentaerythritol pentaacrylate, pentaerythritol triacrylate, ethoxylated pentaerythritol tetraacrylate, and caprolactone modified dipentaerythritol hexaacrylate.

Oligomeric (meth)acryl monomers such as, for example, urethane acrylates may also be employed.

Such (meth)acrylate monomers are widely available from vendors such as, for example, Sartomer Company of Exton, Pa.; Cytec Industries of Woodland Park, N; and Aldrich Chemical Company of Milwaukee, Wis.

In some embodiments, the polyacrylate polymer includes a (meth)acrylate monomer comprising at least three (meth)acrylate functional groups. In some embodiments, the cross-linking monomer comprises at least four, five or six (meth)acrylate functional groups. Acrylate functional groups may be favored over (meth)acrylate functional groups.

Preferred functional acrylates include for example trimethylolpropane triacrylate (commercially available from Sartomer Company, Exton, Pa. under the trade designation "SR351"), ethoxylated trimethylolpropane triacrylate (commercially available from Sartomer Company, Exton, Pa. under the trade designation "SR454"), pentaerythritol tetraacrylate, pentaerythritol triacrylate (commercially available from Sartomer under the trade designation "SR444"), dipentaerythritol pentaacrylate (commercially available from Sartomer under the trade designation "SR399"), ethoxylated pentaerythritol tetraacrylate (from Sartomer under the trade designation "SR494"), dipentaerythritol hexaacrylate, and tris(2-hydroxy ethyl) isocyanurate triacrylate (from Sartomer under the trade designation "SR368".

Aliphatic urethane acrylate oligomers may be utilized to form a preferred polyacrylate polymer to enhance compatibility of the polyacrylate polymer and the cross-linked polyurethane, although other aliphatic polyacrylate monomers may also be useful. The polyacrylates or polyurethane acrylates described herein are thermosetting polymers.

The polyacrylate polymer may be formed by free radical polymerization of multifunctional urethane acrylate oligomers. The urethane acrylate oligomer may be mixed with other low molecular weight monofunctional and/or multifunctional acrylates to modify the pre-cured viscosity of the resin for the purposes of processing. Generally the average functionality of the multifunctional acrylate used in the energy dissipation layer prior to cure is less than 3 (i.e. 3 functional acrylate functional groups per molecule) or can be 2 or less. The cured (or crosslinked) material may exhibit stable material properties with respect to the display film use in application, that is, the energy dissipation layer may not exhibit appreciable flow.

Urethane acrylate oligomers can be comprised of a wide variety of urethane materials with acrylate or methacrylate reactive groups. Urethane acrylate oligomers are commercially available from vendors such as, for example, Sartomer of Exton, Pa. (a subsidiary of Arkema) and Allnex (Ebecryl Brand name).

Examples of commercially available aliphatic urethane oligomers include but are not limited to CN9002, CN9004, CN9893, and CN3211 available from Sartomer Company and those sold under the Ebecryl brand name.

The transparent energy dissipation layer may have a glass transition temperature of 15 degrees Celsius or less, 10 degrees Celsius or less, 5 degrees Celsius or less, or 0 degrees Celsius or less, or −5 degrees Celsius or less, or in a range from −40 to 15 degrees Celsius, or in a range from −30 to 15 degrees Celsius, or in a range from −30 to 10 degrees Celsius, or in a range from −30 to 5 degrees Celsius, or in a range from −30 to 0 degrees Celsius, or in a range from −20 to 0 degrees Celsius. The polyacrylate polymer and the cross-linked polyurethane may have a similar glass transition temperature as the transparent energy dissipation layer. The polyacrylate polymer and the cross-linked polyurethane may have different glass transition temperatures.

The display film may include a protective layer. The protective layer provides abrasion resistance to the display film and may also be referred to as an abrasion resistant layer. A protective layer or abrasion resistant layer includes a hardcoat layer, a nanoparticle nanocomposite ionic elastomeric layer, an elastic nanocomposite urethane layer, or a glass layer.

Abrasion is a method of wearing down or rubbing away material by means of friction. The abrasion resistance of a material helps it to withstand mechanical action and tends to protect the removal of materials from its surface. This allows the material to retain its integrity and hold its form. Abrasion resistance can be measured by rubbing or wiping the transparent protective layer for a specified number of cycles with a rough material such as steel wool or a scouring pad and then inspecting the layer for visible changes such as fine scratches or haze.

An abrasion resistant layer may include a hardcoat layer disposed directly on a display film layer (for example on the substrate or energy dissipation layer) or the hardcoat layer may be disposed on a substrate layer and this composite layer is disposed on a display film layer. The hardcoat layer may have a thickness of less than 50 micrometers, or less than 40 micrometers, or a thickness in a range from 2 to 30 micrometers, or from 2 to 15 micrometers, or from 3 to 10 micrometers. The substrate layer may have a thickness greater than 10 micrometers or less than 200 micrometers. The substrate layer preferably is a transparent polymer layer.

The substrate layer (that forms a portion of the protective layer) may have a thickness in a range from 10 to 125 micrometers, or from 25 to 100 micrometers, or from 30 to 85 micrometers. The substrate layer may have a yield stress value greater than 70 MPa, or greater than 90 MPa, or greater than 120 MPa. or greater than 160 MPa. The phrase "yield stress" or "offset yield stress" refers herein to "0.2% offset yield strength" as defined in ASTM D638-14. ASTM D638-14 section A2.6 defines the test method for "offset yield strength" and is defined as the stress at which the strain exceeds by a specified amount (the offset) an extension of the initial proportional portion of the stress-strain curve. It is expressed in force per unit area, usually megapascals (pounds force per square inch).

The substrate layer may be formed of any useful polymeric material that provides the desired mechanical properties (such as dimensional stability) and optical properties (such as light transmission and clarity) to the display film. Examples of materials suitable for use in the polymeric substrate layer include polymethylmethacrylate, polycarbonate, polyamides, polyimide, polyesters (PET, PEN), polycyclic olefin polymers, and thermoplastic polyurethanes. One useful polymeric material for forming the transparent polymeric substrate layer is polyimide. In many embodiments the polyimide substrate layer is colorless. Colorless polyimide can be formed via chemistry or via nanoparticle incorporation. Some exemplary colorless polyimides formed via chemistry are described in WO 2014/092422.

The substrate layer may be primed or treated to impart some desired property to one or more of its surfaces. In particular the substrate layer can be primed to improve adhesion of the energy dissipation layer or glass layer or an optically clear adhesive layer with the substrate layer. Examples of such treatments include corona, flame, plasma and chemical treatments such as, acrylate or silane treatments.

The hardcoat layer (disposed on the substrate) has a thickness of less than 50 micrometers or less than 40 micrometers. The hardcoat layer has a thickness in a range from 2 to 30 micrometers, or from 2 to 15 micrometers, or from 3 to 10 micrometers. The hardcoat layer includes nanoparticles.

Suitable hardcoats can include a variety of cured polymeric materials having inorganic nanoparticles. These hardcoats can include but are not limited to (meth)acrylic based hardcoats, siloxane hardcoats, polyurethane hardcoats and the like. Suitable hardcoats can include a variety of cured polymeric materials having inorganic nanoparticles. These hardcoats can include but are not limited to (meth)acrylic based hardcoats, siloxane hardcoats, polyurethane hardcoats and the like.

One preferable class of hardcoats include acrylic hardcoats comprising inorganic nanoparticles. Such hardcoats can have a polymerizable resin composition comprising mixtures of multifunctional (meth)acrylic monomers, oligomers, and polymers, where the individual resins can be monofunctional, difunctional, trifunctional, tetrafunctional or have even higher functionality. In preferred cases, the polymerizable (meth)acrylate components of the resin system are chosen such that when polymerized the hardcoat contains little to no free (meth)acrylic monomers.

Useful hardcoat multifunctional (meth)acrylate monomers and oligomers are described above as the materials useful for the cross-linked polyacrylate polymer.

The hardcoat composition may include surface modified inorganic oxide particles that add mechanical strength and durability to the resultant coating. The particles are typically substantially spherical in shape and relatively uniform in size. The particles can have a substantially monodisperse size distribution or a polymodal distribution obtained by blending two or more substantially monodisperse distributions. The inorganic oxide particles are typically non-aggregated (substantially discrete), as aggregation can result in precipitation of the inorganic oxide particles or gelation of the hardcoat. The size of inorganic oxide particles is chosen to avoid significant visible light scattering.

The hardcoat composition may comprise a significant amount of surface modified inorganic oxide nanoparticles having an average (e.g. unassociated) primary particle size or associated particle size of at least 10, 20, 30, 40 or 50 nm and no greater than about 200, 175 or 150 nm. When the hardcoat composition lacks a significant amount of inorganic nanoparticles of such size, the cured hardcoat can crack when subjected to the pencil hardness test. The total concentration of inorganic oxide nanoparticles is typically a least 30, 35, or 40 wt-% solids and generally no greater than 90 wt-%, 80 wt-%, or 75 wt-% and in some embodiments no greater than 70 wt-%, or 65 wt-%, or 60 wt-% solids.

The hardcoat composition may comprise up to about 10 wt-% solids of smaller nanoparticles. Such inorganic oxide nanoparticles typically having an average (e.g. unassociated) primary particle size or associated particle size of at least 1 nm or 5 nm and no greater than 50, 40, or 30 nm.

The average particle size of the inorganic oxide particles can be measured using transmission electron microscopy to count the number of inorganic oxide particles of a given diameter. The inorganic oxide particles can consist essentially of or consist of a single oxide such as silica, or can comprise a combination of oxides, or a core of an oxide of one type (or a core of a material other than a metal oxide)

on which is deposited an oxide of another type. Silica is a common inorganic particle utilized in hardcoat compositions. The inorganic oxide particles are often provided in the form of a sol containing a colloidal dispersion of inorganic oxide particles in liquid media. The sol can be prepared using a variety of techniques and in a variety of forms including hydrosols (where water serves as the liquid medium), organosols (where organic liquids so serve), and mixed sols (where the liquid medium contains both water and an organic liquid).

Aqueous colloidal silicas dispersions are commercially available from Nalco Chemical Co., Naperville, Ill. under the trade designation "Nalco Colloidal Silicas" such as products 1040, 1042, 1050, 1060, 2327, 2329, and 2329K or Nissan Chemical America Corporation, Houston, Tex. under the trade name Snowtex™. Organic dispersions of colloidal silicas are commercially available from Nissan Chemical under the trade name Organosilicasol™. Suitable fumed silicas include for example, products commercially available from Evonki DeGussa Corp., (Parsippany, N.J.) under the trade designation, "Aerosil series OX-50", as well as product numbers -130, -150, and -200. Fumed silicas are also commercially available from Cabot Corp., Tuscola, Ill., under the trade designations CAB-O-SPERSE 2095", "CAB-O-SPERSE A105", and "CAB-O-SIL M5".

It may be desirable to employ a mixture of inorganic oxide particle types to optimize an optical property, material property, or to lower that total composition cost.

As an alternative to or in combination with silica, the hardcoat may comprise various high refractive index inorganic nanoparticles. Such nanoparticles have a refractive index of at least 1.60, 1.65, 1.70, 1.75, 1.80, 1.85, 1.90, 1.95, 2.00 or higher. High refractive index inorganic nanoparticles include for example zirconia ("$ZrO_2$"), titania ("$TiO_2$"), antimony oxides, alumina, tin oxides, alone or in combination. Mixed metal oxide may also be employed.

Zirconias for use in the high refractive index layer are available from Nalco Chemical Co. under the trade designation "Nalco OOSS008", Buhler AG Uzwil, Switzerland under the trade designation "Buhler zirconia Z-WO sol" and Nissan Chemical America Corporation under the trade name NanoUse ZR™. Zirconia nanoparticles can also be prepared such as described in U.S. Patent Publication No. 2006/0148950 and U.S. Pat. No. 6,376,590. A nanoparticle dispersion that comprises a mixture of tin oxide and zirconia covered by antimony oxide (RI –1.9) is commercially available from Nissan Chemical America Corporation under the trade designation "HX-05M5". A tin oxide nanoparticle dispersion (RI –2.0) is commercially available from Nissan Chemicals Corp. under the trade designation "CX-S401M". Zirconia nanoparticles can also be prepared such as described in U.S. Pat. Nos. 7,241,437 and 6,376,590.

The protective layer may be an elastic nanocomposite layer. The elastic nanocomposite layer may be a nanoparticle nanocomposite ionic elastomeric layer, or an elastic nanocomposite urethane layer. The nanoparticle nanocomposite ionic elastomeric layer, or the elastic nanocomposite urethane layer may be directly coated onto the energy dissipation layer or optically clear adhesive layer. Alternatively, the nanoparticle nanocomposite ionic elastomeric layer, or the elastic nanocomposite urethane layer may be coated onto a transparent substrate layer, as described above, and the transparent substrate layer is directly attached to the energy dissipation layer or optically clear adhesive layer.

Figure 9:
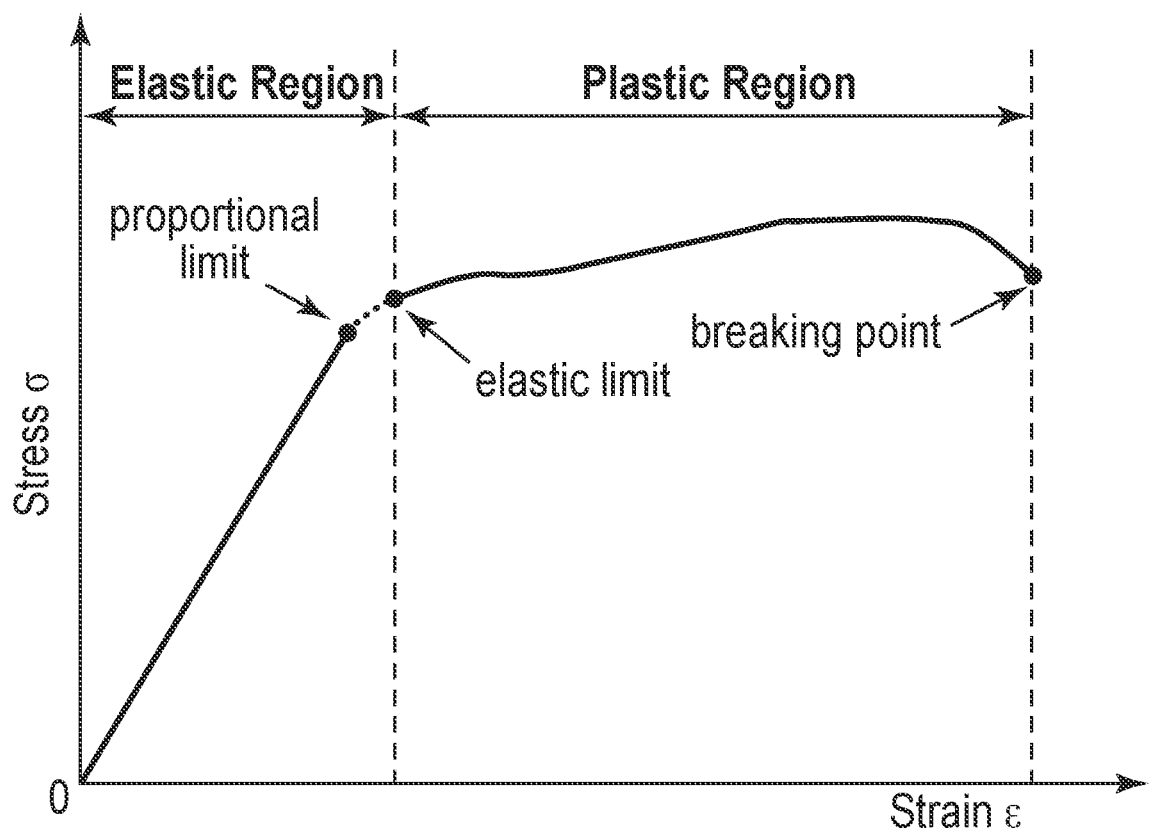
FIG. 9 is a stress-strain graph illustrating the elastic and plastic regions, proportional and elastic limits, and the breaking point for a material.

The transparent protective layer may be an elastic nanocomposite layer. This layer may have a thickness in a range from 30 to 125 micrometers. This elastic nanocomposite material can be made from any useful material that provides durable surface properties to the outer layer. In some cases, this elastic nanocomposite layer is made from polyurethane nanocomposite materials such as silica nanoparticle filled UV curable polyurethane resins. In other embodiments the elastic nanocomposite material can be made from nanoparticle filled ionic elastomer materials. This elastic nanocomposite layer is capable of stretching within an elastic range, so that permanent deformation does not occur. The proportional limit for a material is defined as the maximum stress at which the stress is proportional to strain (Hooke's law). The elastic limit is the minimum stress at which permanent deformation can be measured. The elastic nanocomposite layer may have a strain at the elastic limit that is 20% greater than the strain at the proportional limit, 50% greater than the strain at the proportional limit, or 100% greater than the strain at the proportional limit. FIG. 9 illustrates this concept.

The protective layer 15 of any of the constructions described may be a glass layer. The transparent glass layer may be formed of any useful glass material. The transparent glass layer may be treated to provide beneficial properties. For example, the transparent glass layer may be ion implanted, chemically strengthened or tempered, and the like. The transparent glass layer may have a thickness that is appropriate for a given bend radius or radius of curvature. The transparent glass layer may have a thickness of 500 micrometers or less, or from 300 micrometers or less or from 10 to 200 micrometers, or from 25 to 100 micrometers or from 25 to 50 micrometers. Suppliers of thin transparent glass include Corning, Nippon Electric Glass, Schott and Asahi Glass.

The overall thickness of the display film described herein may have any useful value depending on the application. The thickness of the display film is a balance between being thick enough to provide the desired display protection and thin enough to provide the folding and reduced thickness design parameters. When the display film folds upon itself, then this film may have a total thickness in a range from 85 to 350 micrometers or from 100 to 300 micrometers or from 150 to 250 micrometers. When the display film moderately flexes, then this film may have total thickness in a range from 300 to 500 micrometers. When the display film is curved but does not appreciably flex, then this film may have total thickness in a range from 500 to 1000 micrometers.

The display film may include one or more additional layers on or between the transparent polymeric substrate layer 12 and the transparent energy dissipation layer 14. These optional layers may include a transparent barrier layer (thickness from 3 to 200 nanometers), a microstructure layer, an anti-glare layer, anti-reflective layer, or an anti-fingerprint layer.

The display film may maintain a haze value of 2% or less, or 1.5% or less, or 1% or less after at least 10,000, 25,000, 50,000 or 100,000 bending or folding cycles about a 3 mm radius. The display film may maintain a stable haze value, or remain intact without cracking or delaminating, after at least 10,000, 25,000, 50,000 or 100,000 bending or folding cycles about a 5 mm radius, or about a 4 mm radius, or about a 3 mm radius, or about a 2 mm radius, or about a 1 mm radius. The display film may remain intact after at least 10,000, 25,000, 50,000 or 100,000 bending or folding cycles about a 3 mm radius or less.

Figure 8:
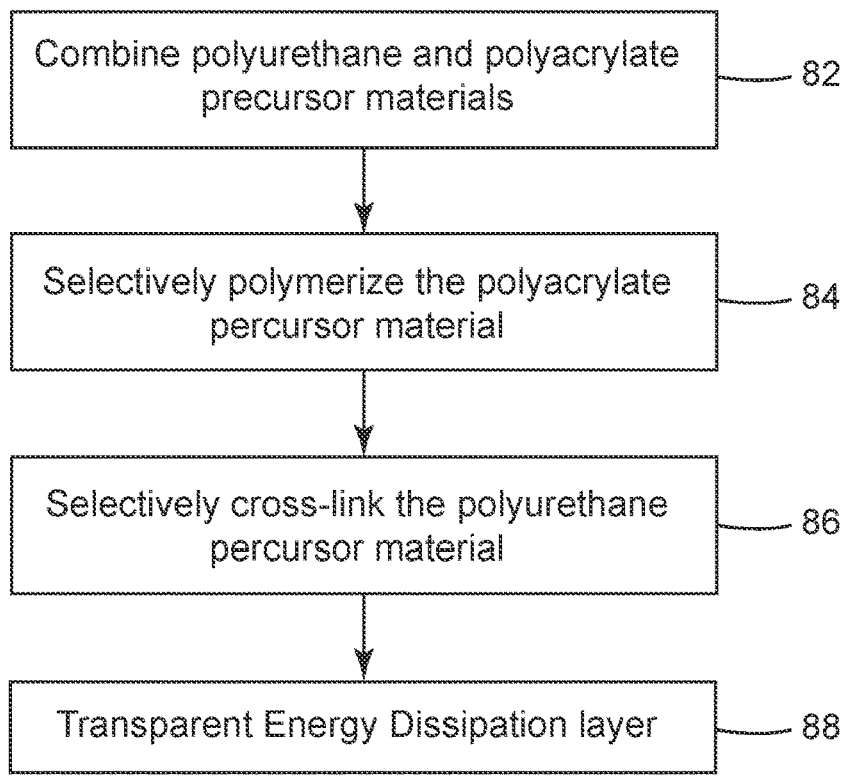
FIG. 8 is a schematic flow diagram of an illustrative method of forming the dual cure display film.

FIG. 8 is a schematic flow diagram of an illustrative method 80 of forming the dual cure display film. The method 80 includes combining polyurethane precursor materials with polyacrylate precursor materials to form a precursor mixture (block 82). Then the method includes selectively polymerizing the polyacrylate precursor materials to form a polyacrylate polymer within the precursor mixture to form a b-stage material (block 84). Then the method includes selectively crosslinking the polyurethane precursor materials within the b-stage material to form a transparent energy dissipation layer (block 86). The transparent energy dissipation layer includes cross-linked polyurethane and a polyacrylate polymer. The transparent energy dissipation layer has a glass transition temperature of 27 degrees Celsius or less and a Tan Delta peak value of 0.5 or greater (block 88).

The combining step of block 82 may include combining a catalyst material with the polyurethane precursor materials and combining a photo-initiator with the polyacrylate precursor materials.

The combining step of block 82 may include combining polyacrylate precursor materials including multifunctional acrylate monomers or oligomers or multifunctional urethane acrylate oligomers to form a polymerized or crosslinked polyacrylate or polyurethane acrylate. The combining step of block 82 may include combining polyacrylate precursor materials that include aliphatic urethane acrylate oligomers.

The selectively crosslinking steps of block 84 and block 86 may include photo-curing the polyacrylate precursor materials to form the polyacrylate polymer (block 84), and thermally curing the polyurethane precursor materials to form the cross-linked polyurethane polymer (block 86).

The precursor mixture may be coated or disposed on the substrate layer prior to the curing steps. The method may be carried out on a roll-to-roll continuous process. The substrate may travel past a photo-curing station and then into an oven to for thermal curing.

Utilizing the described precursor mixture and dual cure method provides unique advantages when forming the described protective display films. The precursor mixture may be made to build viscosity via a UV initiated polymerization of the minor acrylic monomer/oligomer components prior to the thermally initiated polymerization of the polyurethane isocyanate and polyol components. This b-stage step can provide beneficial build in viscosity that reduces generation of defects during processing and improves the general manufacturability of the described protective display films.

Objects and advantages of this disclosure are further illustrated by the following examples, but the particular materials and amounts thereof recited in these examples, as well as other conditions and details, should not be construed to unduly limit this disclosure.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

TABLE 1

Materials

| Abbreviation or Trade Designation | Description |
|---|---|
| Polyol-1 | Aliphatic polyester polyol, commercially available from King Industries, Norwalk, CT under the trade name "K-FLEX 188". |
| Polyisocyanate-1 | Aliphatic polyisocyanate, commercially available from Bayer, Pittsburgh, PA under the trade name "DESMODUR N3300A". |
| Catalyst | Dibutyltin dilaurate catalyst, commercially available from Air Products and Chemicals, Inc., Allentown, PA, under the trade name "DABCO T-12". |
| LmPEN | 50 micrometer thick low melt polyethylene naphthalate polymer co-polyester made from 90% NDC (dimethyl-2,6-naphthalenedicarboxylate) and 10% terephthalic acid, extruded and bi-axially oriented as described below. |
| CN9893 | Aliphatic urethane acrylate, commercially available from Sartomer, Exton, PA. |
| SR494 | Ethoxylated (4) pentaerythritol tetraacryalte, commercially available from Sartomer, Exton, PA. |
| TPO-L | Liquid photoinitiator, commercially available from BASF Resins, Wyanndotte, MI. |

Preparation of Primed LmPEN Film (Substrate for Examples 1-3)

A 90/10 PEN copolymer was prepared as illustrated in Example Control B of U.S. Pat. No. 8,263,731. This material was melt extruded using a twin screw extruder with vacuum applied for moisture removal. The melt was heated to 525° F. and delivered to an extrusion die and quenched on a chilled drum. This quenched film was stretched 3.3-1 at a temperature of 235-250° F. in the machine direction and cooled. This machine direction stretched film was fed to a tenter machine which gripped the film edges, heated the film back to 255-300° F. and stretched the film 3.7-1 up to 4.1-1 in the transverse direction. The film was then annealed at 450° F. for 8 to 30 seconds in the same tenter. The film edges were trimmed off and a polyethylene premask applied before the film was wound into roll form.

A primer solution was made by mixing 52.5 grams of Vitel 2200B (Bostik Americas, Wauwatosa, Wis.) in 2447.5 grams of methyl ethyl ketone (Fisher scientific) to make a homogeneous solution. The primer solution was applied to the stretched 50 micrometer LmPEN films in a roll to roll process where the primer solution was metered through a slot die onto the moving web. Thickness was controlled by the use of a metering pump and a mass flow meter. The volatile components of the coating were then dried in a 3 zone air floatation zone oven. The dried coating was then wound into a roll and the primer coating had a thickness of approximately 81 nm.

Preparation of the Polyol-1 with Catalyst:

In an air mixer at 93° C. were mixed 470 grams of Polyol-1 and 4 drops of Catalyst. To reduce the resultant air bubbles, the mixture was then placed in a vacuum oven overnight at 60° C.

Examples 1 to 4

Three energy dissipation layer precursor solutions with acrylate were prepared as shown in Tables 2, 3, and 4 below.

One comparative energy dissipation layer precursor solution without acrylate was also prepared and shown in Table 5.

For all of the energy dissipation layer precursor solutions with acrylate, the desired amounts of acrylate and photoinitiator were added to the Polyol-1 with catalyst. This was mixed until a uniform solution was achieved. Then Polyisocyanate-1 was added and the solution was mixed in a speed mixer and immediately coated.

For the comparative solution, the Polyol-1 and Polyisocyanate-1 were mixed in speedmixer and coated immediately.

All energy dissipation layer precursor solutions with acrylate solutions and the comparative solution were coated between a 50 micrometer silicone release (UV-30 from CP Films Inc. Fieldale, Va.) and a 50 micrometer LmPEN film having an ~81 nm thick layer of Vitel 2200 B as a primer layer (as described above). Each reactive mixture was placed between the two films and the films were pulled under a notch bar with a gap set to produce a 5 mil (125 micrometer) coating between the films. The final film was first stage cured with ultraviolet (UV) radiation using a Clearstone UV LED lamp at 385 nm for 30 seconds and 100% power. The films were then placed into a 70° C. oven for 16 hours to perform the second stage (thermal) cure. Prior to testing, the release liner film was removed to produce a film construction where the cured energy dissipation layer was in contact with the Vitel 2200B primer side of the LmPEN.

To prepare stand-alone energy dissipation films for DMA testing, the solutions were coated as above but rather than pouring the solution between LmPEN and release liner, the solution was poured between two release liners and pulled under the notch bar and cured. Both release liners were then removed for DMA testing.

TABLE 2

Energy Dissipation Layer with 5% CN9893

| Chemical | Wt % |
| --- | --- |
| Polyol-1 with Catalyst | 55.0% |
| Polyisocyanate-1 | 39.2% |
| TPO-L (photoinitiator) | 1.0% |
| CN9893 (acrylate) | 4.9% |
| Total | 100% |

TABLE 3

Energy Dissipation Layer with 2% SR494

| Chemical | Wt % |
| --- | --- |
| Polyol-1 with Catalyst | 56.7% |
| Polyisocyanate-1 | 40.3% |
| TPO-L (photoinitiator) | 1.1% |
| SR494 (acrylate) | 2.0% |
| Total | 100% |

TABLE 4

Energy Dissipation Layer with 5% SR494

| Chemical | Wt % |
| --- | --- |
| Polyol-1 with Catalyst | 55.0% |
| Polyisocyanate-1 | 39.2% |
| TPO-L (photoinitiator) | 0.9% |

TABLE 4-continued

Energy Dissipation Layer with 5% SR494

| Chemical | Wt % |
| --- | --- |
| SR494 (acrylate) | 4.9% |
| Total | 100% |

TABLE 5

Energy Dissipation Layer

| Chemical | Wt % |
| --- | --- |
| Polyol-1 with Catalyst | 58.0% |
| Polyisocyanate-1 | 42.0% |
| Total | 100% |

Test Methods:

The below testing was performed on the resulting samples.

Static Fold Recovery 2.125"×4.0" samples of the protective films were placed into a test tube rack with spacing between the posts of 1 cm, thereby creating an effective bend radius of 5 mm. The samples were placed into a 60° C. temperature 93% relative humidity controlled chamber for 24 hrs and then removed from the rack and hung in a vertical position for 24 hours. The angle that the protective film samples unfolded to was then recorded with respect to a flat plane. 180 degrees means that the sample remained completely folded. 0 degrees means the sample completely unfolded back to a flat film.

Transmission/Haze/Clarity Testing

Luminous transmission, clarity, and haze were measured according to ASTM D1003-00 using a Byk-Gardner Haze-Guard Plus model 4725 (available from BYK-Gardner Columbia, Md.). Each result is the average of three measurements on a given sample.

Dynamic Mechanical Testing

The glass transition temperature of the energy dissipation coatings was characterized using Q800 DMA from TA Instruments. Samples were cut into strips 6.35 mm wide and about 4 cm long. The thickness of each film was measured. The films were mounted in the tensile grips of a Q800 DMA from TA Instruments with an initial grip separation between 16 mm and 19 mm. The samples were then tested at an oscillation of 0.2% strain and 1 Hz throughout a temperature ramp from −50° C. to 200° C. at a rate of 2° C. per minute. The onset of the glass transition was determined by location of peak for E". The temperature at which the Tan Delta signal reached a maximum was recorded as the peak Tan Delta temperature.

Results and Discussion:

As can be seen in Table 6, adding an acrylate did not significantly change the % transmission, haze, or clarity of these films. In all cases where an acrylate was added the haze of the film actually dropped and clarity remained similar or increased; low haze is highly desirable for this cover film.

Additionally in Table 6 you can see that adding in an acrylate did not negatively affect static fold recovery; all films recovered completely. Lastly in Table 6 you can see that by adding in an acrylate you can get a wide range of viscosity increase ranging from partial gelation to a completely gelled (non flowable) solution without any thermal curing.

In Table 7 you can see that adding the acrylate did not significantly change the tan delta peak or the temperature at which this tan delta peak occurs. This means that with the acrylate modified polyurethane shape memory formulation we are achieving the viscosity increase needed for improved manufacturing without degrading the dampening properties required from the energy dissipation layer.

TABLE 6

Summary of Results for Full Construction

| Sample ID | Acrylate Added | Static Fold Recovery | T % | H % | C % | Gelled After UV? |
|---|---|---|---|---|---|---|
| Example 1 | 5% CN9893 | 0 | 90.7 | 1.17 | 97.3 | slight gel |
| Example 2 | 2% SR494 | 0 | 91.2 | 1.26 | 98.5 | some gel |
| Example 3 | 5% SR494 | 0 | 90.8 | 1.31 | 98.9 | gelled |
| Example 4 (comparative) | None | 0 | 90.7 | 2.24 | 98.5 | no |

TABLE 7

Summary of DMA Results for Energy Dissipation Films (no substrate)

| Sample ID | Acrylate Added | Peak Tan Delta | Temp Tan Delta Max (° C.) |
|---|---|---|---|
| Example 1 | 5% CN9893 | 1.54 | 43.3 |
| Example 2 | 2% SR494 | 1.41 | 44.5 |
| Example 3 | 5% SR494 | 1.24 | 40.0 |
| Example 4 (comparative) | None | 1.48 | 45.9 |

Thus, embodiments of DUAL CURE PROTECTIVE DISPLAY FILMS are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A display film comprising:
   a transparent polymeric substrate layer; and
   a transparent energy dissipation layer disposed on the transparent polymeric substrate layer, the transparent energy dissipation layer comprising cross-linked polyurethane and a polyacrylate polymer, the transparent energy dissipation layer having a glass transition temperature of 27 degrees Celsius or less and a Tan Delta peak value of 0.5 or greater, wherein the transparent energy dissipation layer further comprises a photoinitiator and a catalyst.

2. The display film according to claim 1, wherein the transparent energy dissipation layer comprises from 1% to 50% by weight of the polyacrylate polymer, and the transparent energy dissipation layer comprises from 50% to 99% by weight of the cross-linked polyurethane polymer.

3. The display film according to claim 1, wherein the polyacrylate polymer is present in the transparent energy dissipation layer in an amount from 1% to 20% by weight and the transparent energy dissipation layer comprises from 80% to 99% by weight of the cross-linked polyurethane polymer.

4. The display film according to claim 1, wherein the polyacrylate polymer is cross-linked.

5. The display film according to claim 1, wherein the polyacrylate polymer is a polyacrylate homopolymer.

6. The display film according to claim 1, wherein the display film has a haze value of less than 5 and the display film has a visible light transmission value greater than 85%.

7. The display film according to claim 1, wherein the transparent energy dissipation layer has a glass transition temperature of 15 degrees Celsius or less.

8. The display film according to claim 1, wherein the transparent energy dissipation layer has a Tan Delta peak value of 0.5 or greater, and the cross-linked polyurethane has a cross-link density in a range from 0.1 to 1.0 mol/kg.

9. The display film according to claim 1, further comprising a protective layer disposed on the transparent polymeric substrate layer, and the transparent polymeric substrate layer separates the transparent energy dissipation layer from the protective layer.

10. The display film according to claim 1, further comprising an adhesive layer disposed on the transparent energy dissipation layer, and the transparent energy dissipation layer separates the transparent polymeric substrate layer from the adhesive layer.

11. The display film according to claim 9, wherein the protective layer comprises nanoparticles and has a thickness in a range from 2 to 30 micrometers.

12. The display film according to claim 1, wherein the transparent polymeric substrate layer has a thickness in a range from 10 to 125 micrometers, and a yield stress value greater than 90 MPa.

13. The display film according to claim 1, wherein the display film has a thickness in a range from 85 to 350 micrometers.

14. A display film comprising:
   a transparent energy dissipation layer, the transparent energy dissipation layer comprising cross-linked polyurethane and a polyacrylate polymer, the transparent energy dissipation layer has a glass transition temperature of 27 degrees Celsius or less and a Tan Delta peak value of 0.5 or greater; and
   a transparent protective layer disposed on the transparent energy dissipation layer, wherein the transparent energy dissipation layer further comprises a photoinitiator and a catalyst.

15. The display film according to claim 14, wherein the transparent energy dissipation layer comprises from 1% to 50% by weight of the polyacrylate polymer, and the transparent energy dissipation layer comprises from 50% to 99% by weight of the cross-linked polyurethane polymer.

16. The display film according to claim 14, wherein the polyacrylate polymer is present in the transparent energy dissipation layer in an amount from 1% to 20% by weight.

17. The display film according to claim 14, wherein the polyacrylate polymer is cross-linked.

18. The display film according to claim 14, wherein the polyacrylate polymer is a polyacrylate homopolymer.

19. The display film according to claim 14, wherein the display film has a haze value of less than 5%, and a visible light transmission value greater than 85%.

20. The display film according to claim 14, wherein the transparent energy dissipation layer has a glass transition temperature of 15 degrees Celsius or less.

21. The display film according to claim 14, wherein the transparent energy dissipation layer has a Tan Delta peak value of 0.5 or greater, and the cross-linked polyurethane has a cross-link density in a range from 0.1 to 1.0 mol/kg.

22. The display film according to claim 14, wherein the protective layer is a hardcoat layer comprising nanoparticles and having a thickness in a range from 2 to 30 micrometers.

23. The display film according to claim 14, wherein the protective layer is a glass layer having a thickness in a range from 25 to 250 micrometers.

24. The display film according to claim 14, further comprising an adhesive layer disposed on the transparent energy dissipation layer, and the transparent energy dissipation layer separates the protective layer from the adhesive layer.

25. The display film according to claim 24, further comprising a release or removable liner disposed on the adhesive layer.

26. The display film according to claim 25, further comprising a release or removable liner disposed on the protective layer.

27. The display film according to claim 14, wherein the transparent energy dissipation layer has a thickness in a range from 75 to 200 micrometers.

28. The display film according to claim 14, wherein the display film has a thickness in a range from 85 to 350 micrometers.

29. An article, comprising:
an optical display;
a display film according to claim 1; and
an optical adhesive layer fixing the display film to the optical display.

30. The article according to claim 29, wherein the optical display comprise organic light emitting diodes.

31. The article according to claim 29, wherein the optical display and display film is foldable so that the optical display faces itself and at least a portion of the display film overlaps with another portion of the display film.

32. A method, comprising;
combining polyurethane precursor materials with polyacrylate precursor materials to form a precursor mixture;
selectively polymerizing the polyacrylate precursor materials within the precursor mixture to form a b-stage material;
selectively crosslinking the polyurethane precursor materials within the b-stage material to form a transparent energy dissipation layer,
the transparent energy dissipation layer comprising cross-linked polyurethane and a polyacrylate polymer, the transparent energy dissipation layer has a having a glass transition temperature of 27 degrees Celsius or less and a Tan Delta peak value of 0.5 or greater, wherein the combining step comprises combining a catalyst material with the polyurethane precursor materials and combining a photo-initiator with the polyacrylate precursor materials.

33. The method according to claim 32, wherein the polyacrylate precursor materials comprise multifunctional acrylate monomers or oligomers to form a crosslinked polyacrylate.

34. The method according to claim 32, wherein the polyacrylate precursor materials comprise aliphatic urethane acrylate oligomers.

35. The method according to claim 32, wherein the selectively polymerizing the polyacrylate precursor materials step comprises photo-curing the polyacrylate precursor materials to form the b-stage material, and the selectively crosslinking the polyurethane precursor materials step comprises thermally curing the polyurethane precursor materials to form cross-linked polyurethane polymer.

36. The method according to claim 32, wherein the polyacrylate polymer is present in the transparent energy dissipation layer in an amount from 1% to 20% by weight and the transparent energy dissipation layer comprises from 80% to 99% by weight of the cross-linked polyurethane polymer.

37. The method according to claim 32, further comprising disposing a layer of the precursor mixture onto a substrate.

* * * * *

UNITED STATES PATENT AND TRADEMARK OFFICE
CERTIFICATE OF CORRECTION

PATENT NO. : 11,631,829 B2
APPLICATION NO. : 16/465666
DATED : April 18, 2023
INVENTOR(S) : Karissa Lynn Eckert It is certified that error appears in the above-identified patent and that said Letters Patent is hereby corrected as shown below:

In the Claims

Column 26
Line 12 (approx.), In Claim 6, delete "5" and insert -- 5% --, therefor.

Signed and Sealed this
Twenty-fourth Day of October, 2023

Katherine Kelly Vidal
*Director of the United States Patent and Trademark Office*